(12) United States Patent
Zhang et al.

(10) Patent No.: US 9,356,137 B2
(45) Date of Patent: May 31, 2016

(54) POWER MOS DEVICE STRUCTURE

(71) Applicant: CSMC Technologies Fab1 Co., Ltd., Wuxi, Jiangsu (CN)

(72) Inventors: Shu Zhang, Wuxi (CN); Yanqiang He, Wuxi (CN); TseHuang Lo, Wuxi (CN); HsiaoChia Wu, Wuxi (CN)

(73) Assignee: CSMC TECHNOLOGIES FAB1 CO., LTD., Wuxi, Jiangsu (CN)

( * ) Notice: Subject to any disclaimer, the term of this patent is extended or adjusted under 35 U.S.C. 154(b) by 12 days.

(21) Appl. No.: 14/130,483

(22) PCT Filed: May 7, 2013

(86) PCT No.: PCT/CN2013/075268
§ 371 (c)(1),
(2) Date: Dec. 31, 2013

(87) PCT Pub. No.: WO2013/166957
PCT Pub. Date: Nov. 14, 2013

(65) Prior Publication Data
US 2014/0159151 A1 Jun. 12, 2014

(30) Foreign Application Priority Data
May 10, 2012 (CN) .......................... 2012 1 0142749

(51) Int. Cl.
*H01L 29/78* (2006.01)
*H01L 23/00* (2006.01)
*H01L 23/482* (2006.01)

(52) U.S. Cl.
CPC ........ *H01L 29/7816* (2013.01); *H01L 23/4824* (2013.01); *H01L 24/02* (2013.01); *H01L 24/05* (2013.01); *H01L 24/06* (2013.01); *H01L 24/07* (2013.01); *H01L 24/08* (2013.01); *H01L 24/09* (2013.01); *H01L 29/7835* (2013.01); *H01L 2924/1306* (2013.01); *H01L 2924/13091* (2013.01)

(58) Field of Classification Search
None
See application file for complete search history.

(56) References Cited

U.S. PATENT DOCUMENTS

| | | | | |
|---|---|---|---|---|
| 4,819,052 A * | 4/1989 | Hutter | | 257/378 |
| 5,403,779 A * | 4/1995 | Joshi et al. | | 438/634 |
| 5,629,506 A * | 5/1997 | Harris et al. | | 218/48 |
| 5,726,463 A * | 3/1998 | Brown et al. | | 257/77 |
| 5,851,603 A * | 12/1998 | Tsai et al. | | 427/579 |
| 6,562,674 B1 * | 5/2003 | Tsuura | | 438/215 |
| 8,664,836 B1 * | 3/2014 | Kuypers et al. | | 310/345 |
| 2001/0004115 A1 * | 6/2001 | Olofsson et al. | | 257/177 |
| 2003/0146483 A1 * | 8/2003 | Chien | | 257/459 |
| 2004/0251492 A1 * | 12/2004 | Lin | | 257/335 |
| 2005/0003677 A1 * | 1/2005 | Dean et al. | | 438/754 |
| 2006/0145094 A1 * | 7/2006 | Wilhelmus Van Herpen et al. | | 250/492.2 |
| 2006/0244138 A1 * | 11/2006 | Beaulieu et al. | | 257/736 |
| 2007/0218672 A1 * | 9/2007 | Jacobs | | 438/597 |
| 2008/0079461 A1 * | 4/2008 | Lin et al. | | 326/80 |
| 2008/0099783 A1 * | 5/2008 | Fukamizu et al. | | 257/177 |
| 2012/0037969 A1 * | 2/2012 | Sanders et al. | | 257/296 |

* cited by examiner

*Primary Examiner* — Fei Fei Yeung Lopez
(74) *Attorney, Agent, or Firm* — Han IP Corporation

(57) ABSTRACT

Various embodiments of a power MOS device structure are disclosed. In one aspect, a power MOS device structure includes a plurality of LDMOS and a plurality of bonding pads. The basic units of LDMOS are coupled in parallel and electrically coupled to the bonding pads to couple to a gate terminal, a source terminal, a drain terminal and a substrate of each of the basic units of LDMOS. The basic units of LDMOS are disposed below the bonding pads. The bonding pads include a single layer of metal with a thickness of 3.5 um to 4.5 um and a width of 1.5 um to 2.5 um. The region below the bonding pads of the power MOS device of the present disclosure is utilized to increase the number of basic units of LDMOS, thereby effectively reducing the on-resistance.

10 Claims, 2 Drawing Sheets

POWER MOS DEVICE STRUCTURE

CROSS REFERENCE TO RELATED APPLICATIONS

This application is the U.S. national phase application of International application number PCT/CN2013/075268, filed on 7 May 2013, which claims the priority benefit of China Patent Application No. 201210142749.0, filed on 10 May 2012, which is hereby incorporated by reference in its entirety.

TECHNICAL FIELD

The present disclosure is related to a power metal-oxide-semiconductor field-effect transistor (MOSFET) device structure and, more particularly, to a low on-resistance power MOS device structure in the field of semiconductor device manufacturing.

BACKGROUND

The drain-source on-resistance of a power MOS device determines its application power. When the on-resistance is small, the device provides an excellent switching characteristics with a relatively greater output current, resulting in a stronger drive capability. Thus, it is desirable to reduce the on-resistance of power MOS devices.

It can be seen that, according to the formula for calculating the on-resistance $R=(\rho*L)/(d*W)$, the greater the channel width W, the lower the on-resistance R. Therefore, multiple LDMOS (Lateral Double-diffused MOS) basic units coupled in parallel may be used in a power MOS device to achieve an increase in total channel width to thereby reduce the on-resistance.

Existing power MOS devices that employ multiple basic units of LDMOS coupled in parallel include an internal chip device and an external chip device, with the internal chip device including multiple basic units of LDMOS coupled in parallel. The external chip device is located in the boding pad region external to the chip. The bonding pad is used to connect the internal chip device to the outside, and is typically provided in an area outside the chip. The material of the bonding pad may be an electrically conductive metal such as copper or aluminum, and the bonding pad takes up about 5~20% of the area of the die. FIG. 1 is a schematic diagram of a conventional power MOS device having multiple basic units of LDMOS coupled in parallel. The striped region represent the multiple basic units of LDMOS and the blocked regions represent the bonding pad area. In existing designs, in consideration of the potential of damage to components below the bonding pad due to the stress from packaging and wiring, it is common to avoid having components below the bonding pad. FIG. 2 is a cross-sectional view of the power MOS device having multiple basic units of LDMOS coupled in parallel of FIG. 1. As shown, there are multiple basic units of LDMOS 100 and a bonding pad region 101, with a portion of the upper metal 103 that is not covered by the passivation layer region 102 as the bonding pad.

To further reduce the on-resistance, there is a need to increase the number of basic units of LDMOS. As there are no components disposed below the bonding pad, the area of the die occupied by the basic units of LDMOS tends to increase and the number of the basic units of LDMOS increases. This would result in higher cost.

Accordingly, the present disclosure provides a novel power MOS device structure that utilizes the area of the bonding pad region to effectively reduce the on-resistance without changing the size of chip area or cost.

SUMMARY

A technical solution provided by the present disclosure is a power MOS device structure that effectively reduces the device on-resistance.

To address the aforementioned technical problem, the technical solution of the present disclosure is as follows:

A power MOS device structure includes a plurality of basic units of LDMOS and a plurality of bonding pads. The basic units of LDMOS are coupled in parallel and are electrically coupled to the bonding pads through metal to couple to a gate terminal, a source terminal, a drain terminal and a substrate of each of the basic units of LDMOS. The power MOS device structure is characterized in that the basic units of LDMOS are disposed directly below the bonding pads, where the plurality of bonding pads include a single layer of metal with a thickness of 3.5 um to 4.5 um and a width of 1.5 um to 2.5 um.

Preferably, in one embodiment, a first metal layer is disposed between the plurality of bonding pads and the plurality of basic units of LDMOS. The plurality of basic units of LDMOS, the first metal layer and the plurality of bonding pads are electrically coupled by one or more metal plugs.

Preferably, in one embodiment, the plurality of bonding pads include a gate bonding pad, a source bonding pad, a drain bonding pad and a substrate bonding pad that are respectively coupled to the gate terminal, the source terminal, the drain terminal and the substrate of the plurality of basic units of LDMOS, which are coupled in parallel.

Preferably, in one embodiment, the single layer of metal includes aluminum-copper metal or aluminum-silicon-copper metal.

Preferably, in one embodiment, the plurality of bonding pads further include a barrier layer below the single layer of metal. The barrier layer includes a titanium layer and a titanium nitride layer. The thickness of the titanium layer is 300 Å~600 Å, and the thickness of the titanium nitride layer is 300 Å~800 Å.

Preferably, in one embodiment, the plurality of bonding pads further include an anti-reflection layer above the single layer of metal. The anti-reflection layer includes a titanium layer and a titanium nitride layer. The thickness of the titanium layer is 100 Å~400 Å, and the thickness of the titanium nitride layer is 250 Å~400 Å.

Preferably, in one embodiment, a surface of the power MOS device structure is covered by a passivation layer. The passivation layer includes one or more openings to expose the plurality of bonding pads. The passivation layer includes, in an order from bottom to top: a layer of plasma-rich silicon oxide film having a thickness of 1 kÅ to 2 kÅ, a layer of high-density plasma silicon dioxide film having a thickness of 10 kÅ 20 kÅ, and a layer of plasma silicon nitride film having a thickness of 7 kÅ to 11 kÅ.

Advantages of the invention of the present disclosure include the following:

The present disclosure fully utilizes the chip area under the bonding pads of the power MOS device. Without increasing the total size of the chip area, the number of the basic units of LDMOS in parallel is increased to effectively reduce the on-resistance. In production a thick metal structure of linewidth of 2 um and thickness of 4 um is used for the bonding pads for stress relief to avoid damage to device performance due to pressure welding process, thereby ensuring device performance and reliability.

BRIEF DESCRIPTION OF THE DRAWINGS

In order to more clearly illustrate embodiments of the present disclosure or the prior art, a brief description of the drawings related to the embodiments of the present disclosure or the prior art is provided below. Apparently, the below-described drawings pertain to a few embodiments of the present disclosure. Those with ordinary skill in the art may obtain other drawings based on these drawings without any creative effort.

DETAILED DESCRIPTION OF THE PREFERRED EMBODIMENTS

In order to more clearly illustrate embodiments of the invention described in the present disclosure, the following description of embodiments of the present disclosure is provided in reference to the figures. Of course, the disclosed embodiments are merely some illustrative examples of implementation of the invention and do not represent the invention as a whole. Any and all alternative embodiments derived by those of ordinary skill in the art based on the disclosed embodiments are deemed to be within the protective scope of the invention of the present disclosure.

As described in the background section, existing designs of a power MOS device typically do not have components below the bonding pad in consideration of the potential damage to any component below the bonding pad due to stress of packaging and wiring process. Instead, in order to achieve the goal of reduced on-resistance, an increased number of basic units of LDMOS is employed at the expense of the size of chip area. Power MOS devices manufactured under this approach tend to have relatively large size of chip area and higher cost of manufacturing. Thus, to reduce the size of chip area and effective reduce the on-resistance, inventors of the present disclosure designed a novel power MOS device structure. The inventive structure utilizes the region under the bonding pad to increase the number of basic units of LDMOS, thus effectively reducing the on-resistance as well as the size of chip area, and ensuring the reliability of device performance. Detailed description of the device structure and related processes is provided below.

In one embodiment, a power MOS device structure includes a plurality of basic units of LDMOS and a plurality of bonding pads. The plurality of basic units of LDMOS are coupled in parallel and are electrically coupled to the plurality of bonding pads to lead to the gate terminal, source terminal, drain terminal and substrate of the plurality of basic units of LDMOS. In particular, the basic units of LDMOS are disposed below the plurality of bonding pads. The plurality of bonding pads include a single layer of metal of a thickness of about 3.5 um to 4.5 um and a line-width of about 1.5 um to 2.5 um.

Figure 1:
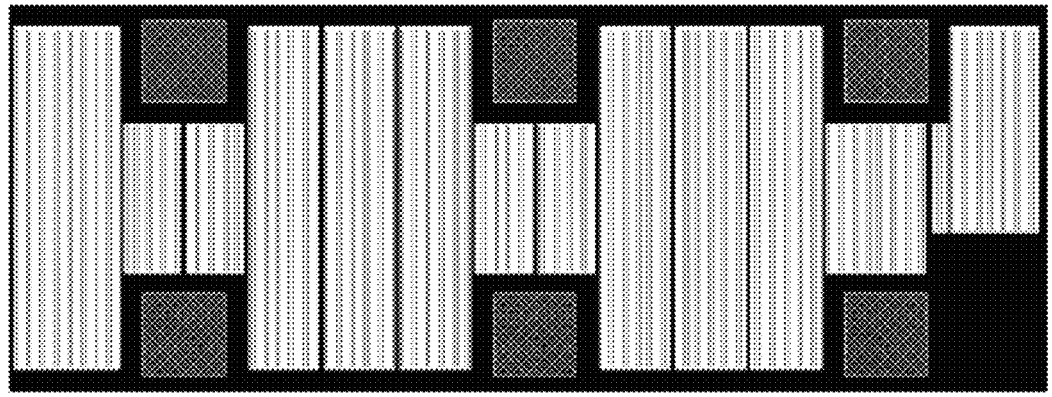
FIG. 1 is a schematic diagram of a conventional power MOS device having a plurality of basic units of LDMOS coupled in parallel.
Figure 2:
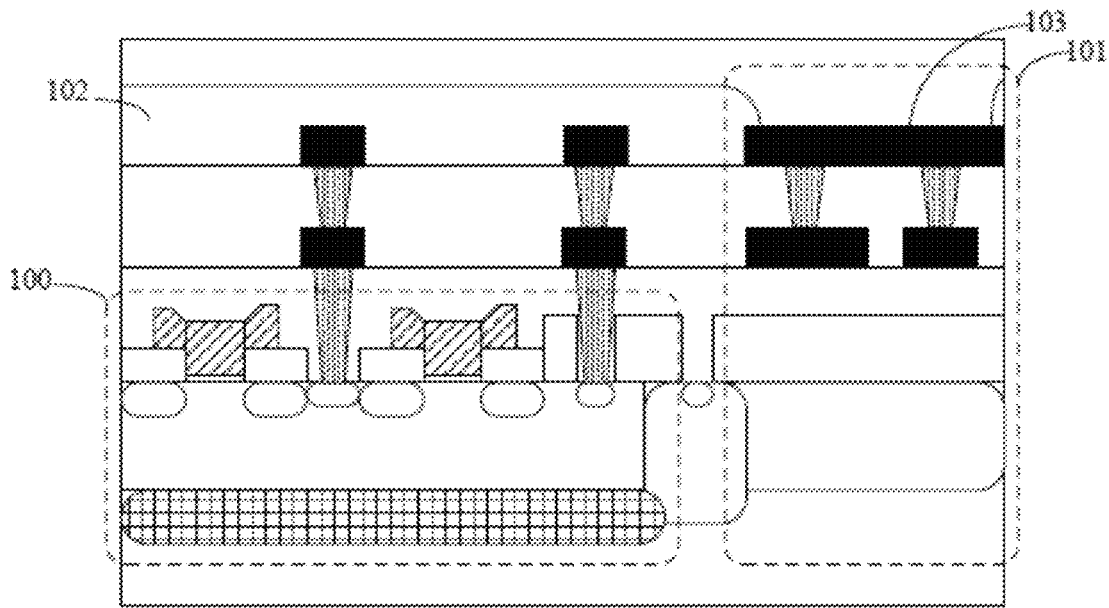
FIG. 2 is a cross sectional view of a conventional power MOS device having a plurality of basic units of LDMOS coupled in parallel.
Figure 3:
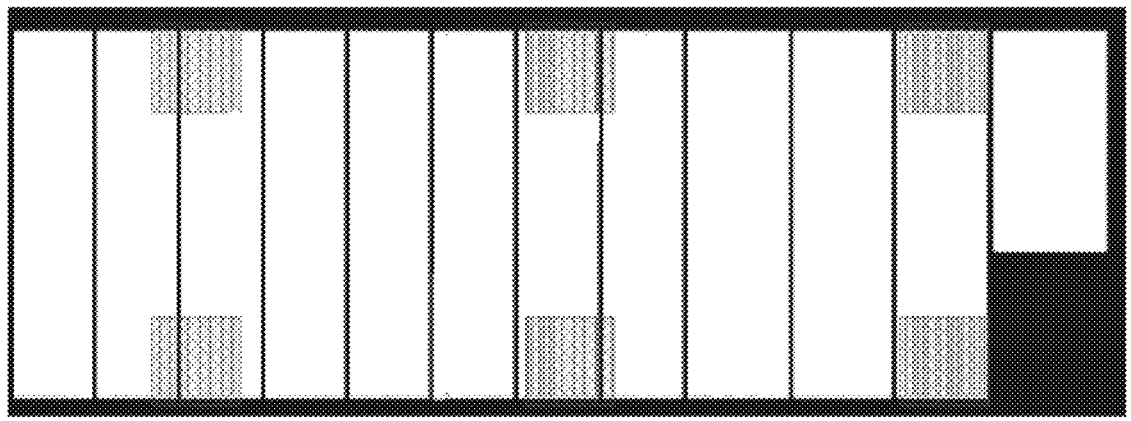
FIG. 3 is a schematic diagram of a power MOS device in accordance with an embodiments of the present disclosure.

Referring to the schematic design shown in FIG. 3, the striped regions represent a plurality of basic units of LDMOS and the blocked regions represent regions of bonding pads. In this design of power MOS device structure, in comparison with the conventional design (as shown in FIG. 1), basic units of LDMOS are also disposed below the bonding pads. This design provides an increased number of basic units of LDMOS utilizing the region below the bonding pads to reduce the on-resistance.

Figure 4:
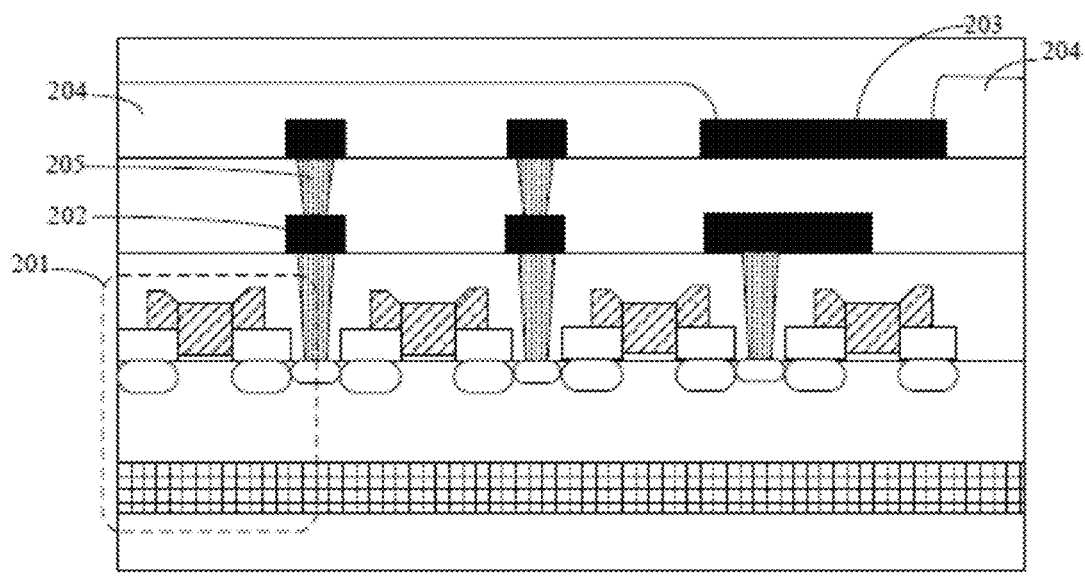
FIG. 4 is a cross-sectional view of a power MOS device in accordance with an embodiments of the present disclosure.

Referring to the partial cross-sectional view of a power MOS device shown in FIG. 4, the structure includes basic units of LDMOS 201 are below a first metal layer 202 and a second metal layer 203. A passivation layer 204 covers over a surface of the second metal layer 203, which is also the surface of the power MOS device. One or more openings are disposed above the passivation layer 204 to expose portions of the second metal layer 203 to function as bonding pads. The plurality of basic units of LDMOS 201, the first metal layer 202 and the plurality of bonding pads (formed by the second metal layer 203) are electrically coupled together by metal plugs 205. In particular, terminals (source, drain, gate, substrate) of the LDMOS below the bonding pads are first coupled to regions outside the bonding pads by the first metal layer 202, and then coupled to the bonding pads by metal plugs 205 and the second metal layer 203. Metal connections of the circuit may be implemented by designing the locations of the first metal layer 202, the second metal layer 203 and the metal plugs 205, thereby coupling the basic units of LDMOS in parallel to couple the gate terminal, source terminal, drain terminal and substrate of the plurality of basic units of LDMOS in parallel. As the coupling is well known in the art, detailed description thereof is not provided in the interest of brevity. Preferably, the plurality of bonding pads may include gate bonding pads, source bonding pads, drain bonding pads and substrate bonding pads as well as the gate terminal, source terminal, drain terminal and substrate of the respectively coupled plurality of basic units of LDMOS. Of course, the design of two metal layers as shown in FIG. 4 is a preferred embodiment, and single layer of metal or more layers of metal may be utilized depending on the actual implementation to provide metal connections for the circuit.

In one preferred embodiment, the metal layer that forms the bonding pads may be aluminum-copper metal or aluminum-silicon-copper metal. The bonding pads may further include a barrier layer below the metal layer as well as an anti-reflection layer above the metal layer in order to improve device performance. Preferably, the barrier layer may include a titanium layer and a titanium nitride layer. The thickness of the titanium layer is preferably 300 Å~600 Å, and the thickness of the titanium nitride layer is preferably 300 Å~800 Å. The anti-reflection layer may include a titanium layer and a titanium nitride layer, with the thickness of the titanium layer being preferably 100 Å~400 Å and the thickness of the titanium nitride layer being preferably 250 Å~400 Å. Preferably, the passivation layer may include, in an order from bottom to top: a layer of plasma-rich silicon oxide film having a thickness of 1 kÅ to 2 kÅ, a layer of high-density plasma silicon dioxide film having a thickness of 10 kÅ 20 kÅ, and a layer of plasma silicon nitride film having a thickness of 7 kÅ to 11 kÅ.

A process of manufacturing the above-described power MOS device is described below.

Device components of the bottom layer are made first. Processes of diffusion, thin film, photolithography, etching are used to form multiple basic units of LDMOS. For example, a number of N of basic units of LDMOS each with dimensions of a channel length L=1.5+/−0.3 um, a drift region length C=0.8+/−0.2 um, and an overlap region of a gate region and the drift region B=0.5+/−0.1 um. After completion of fabrication of device components of the reduce layer, metal fabrication processes are used to form a first metal layer, a second metal layer and metal plugs to form the desired circuit. The gate terminal, source terminal, drain terminal and substrate of the basic units of LDMOS are coupled to the first metal layer by the metal plugs, and are further coupled to the second metal layer by the metal plugs between the metal layers to be connected to the outside, such as an external testing pad. The second metal layer may include a plurality of bonding pads. The process may form a passivation layer over the second metal layer, with one or more openings through the passivation layer to expose the bonding pads.

The process of manufacturing the second metal layer may include the following:

A thick metal deposition step is carried out to deposit a barrier layer, a single metal layer and an anti-reflection layer. The thickness of the metal layer is a about 3.5 um to 4.5 um. The anti-reflection layer may include a titanium layer and a titanium nitride layer.

A metal patterning step is carried out to coat a photoresist layer on the anti-reflection layer. A mask is used to expose the photoresist layer to light to cause areas of the photoresist layer corresponding to hollow patterns of the mask to deteriorate. The deteriorated portions of the photoresist layer are removed by etching so that the remaining portions of the photoresist layer form a mask to allow etching of the metal layer to form a textured structure having a feature size of 1.5 um to 2 um in the surface of the single metal layer.

A passivation step is carried out to form a passivation layer over the surface of the single metal layer that has the concavo-convex structure. The passivation layer is at least partially filled in the textured structure of the single metal layer.

Preferably, the thick metal deposition step may include the following:

A barrier layer is first formed on a surface of a chip. The barrier layer may include a titanium layer and a titanium nitride layer. The thickness of the titanium layer is 300 Å~600 Å, and the thickness of the titanium nitride layer is 300 Å~800 Å. A signal metal layer is formed over the barrier layer, which may include an aluminum-copper layer or an aluminum-silicon-copper layer. An anti-reflection layer is formed over the single metal layer. The anti-reflection layer may include a titanium layer and a titanium nitride layer. The thickness of the titanium layer is 100 Å~400 Å, and the thickness of the titanium nitride layer is 250 Å~400 Å.

Preferably, the formation of the passivation layer may include the following:

A plasma deposition process is carried out to deposit a layer of plasma-rich silicon oxide film over the textured surface of the single metal layer, having a thickness of 1 kÅ to 2 kÅ. A high-density plasma deposition process is carried out to deposit a layer of high-density plasma silicon dioxide film over the plasma-rich silicon oxide film layer, having a thickness of 10 kÅ to 20 kÅ. A plasma deposition process is then carried out to deposit a layer of plasma silicon nitride film over the high-density plasma silicon dioxide film layer, having a thickness of 7 kÅ to 11 kÅ.

The following test was carried out to test the feasibility of the design of the present disclosure:

The substrate and source terminals, which are coupled to an external testing pad, are coupled to the ground. A voltage of 0.2V is applied to the drain terminal. A voltage applied to the gate terminal swings from 0V to 6V, with an increment of 0.1V. The drain and source bonding pads in the chip are tested with voltages V1 and V2, respectively, and the electrical current from the external testing pad to the drain terminal is Id.

With the gate terminal voltage being Vg=3.6V, the device on-resistance is calculated as Rdson=|(V1-V2)/Id|vg=3.6V.

According to the data shown in Table 1 below, the on-resistance of the device structure of embodiments of the present disclosure is 23.3% reduce than that of conventional device structure.

TABLE 1

| Comparison of On-Resistance Data | | |
|---|---|---|
| Device Structure | Conventional Device Structure | Device Structure of Present Disclosure |
| On-Resistance/mohm | 176 | 135 |
| Difference in proportion | =(176 − 135)/176 * 100% = 23.3% | |

In summary, in the power MOS device structure of the present disclosure, the base units of LDMOS may be disposed below the bonding pad without changing the size of chip area and without changing the size of the power MOS device structure, to achieve a reduction in Rdson by 23.3%. Alternatively, the size of chip area may be reduced by 30.4% when the on-resistance remains unchanged.

The above description of the disclosed embodiments enable those skilled in the art to make or use the invention. Various modifications by those skilled in the art may be made based on the principles defined herein without departing from the spirit or scope of the present disclosure. Accordingly, invention described in the present disclosure is not limited to those embodiments shown herein, and has a scope consistent with the disclosed principles and the novel features of the broadest range.

What is claimed is:

1. A power MOS device structure, comprising:
   a semiconductor substrate having a plurality of basic units of lateral double-diffused metal-oxide semiconductor (LDMOS) formed thereon;
   a first metal layer disposed above the semiconductor substrate;
   a second metal layer disposed above the first metal layer and having a plurality of bonding pads; and
   a plurality of metal plugs disposed between and electrically connecting the first metal layer and the second metal layer,
   wherein:
      the basic units of LDMOS are coupled in parallel and electrically coupled to the bonding pads to couple a gate terminal, a source terminal, a drain terminal and a substrate terminal of each of the basic units of LDMOS to the bonding pads,
      at least one of the basic units of LDMOS is disposed directly below a respective bonding pad of the plurality of bonding pads, and
      each of the gate terminal, the source terminal, the drain terminal and the substrate terminal of the at least one of the basic units of LDMOS disposed directly below the respective bonding pad is firstly coupled to a region outside a perimeter of the respective bonding pad via the first metal layer, and then subsequently coupled to at least one of the bonding pads via at least one of the plurality of metal plugs and the second metal layer.

2. The power MOS device structure of claim 1, further comprising a first metal layer disposed between the plurality of basic units of LDMOS and the plurality of bonding pads, wherein the basic units of LDMOS, the first metal layer and the bonding pads are electrically coupled by metal plugs.

3. The power MOS device structure of claim 1, wherein the plurality of bonding pads comprises a gate bonding pad, a source bonding pad, a drain bonding pad, and a substrate bonding pad that are coupled to the gate terminal, source terminal, drain terminal, and source terminal of each of the plurality of basic units of LDMOS which are coupled in parallel.

4. The power MOS device structure of claim 1, wherein the plurality of bonding pads comprises a single layer of metal with a thickness of 3.5 um to 4.5 um and a width of 1.5 um to 2.5 um, the single layer of metal comprising aluminum-copper metal or aluminum-silicon-copper metal.

5. The power MOS device structure of claim 4, wherein the plurality of bonding pads further comprises a barrier layer below the single layer of metal.

6. The power MOS device structure of claim 5, wherein the barrier layer comprises a titanium layer and a titanium nitride layer, a thickness of the titanium layer being 300 Å~600 Å and a thickness of the titanium nitride layer being 300 Å~800 Å.

7. The power MOS device structure of claim 4, wherein the plurality of bonding pads further comprise an anti-reflection layer above the single layer of metal.

8. The power MOS device structure of claim 7, wherein the anti-reflection layer comprises a titanium layer and a titanium nitride layer, a thickness of the titanium layer being 100 Å-400 Å and a thickness of the titanium nitride layer being 250 Å~400 Å.

9. The power MOS device structure of claim 1, further comprising a passivation layer over a surface of the power MOS device structure with one or more openings exposing the plurality of bonding pads.

10. The power MOS device structure of claim 9, wherein the passivation layer comprises a layer of plasma-rich silicon oxide film having a thickness of 1 kÅ to 2 kÅ, a layer of high-density plasma silicon dioxide film having a thickness of 10 kÅ to 20 kÅ and disposed over the layer of plasma-rich silicon oxide film, and a layer of plasma silicon nitride film having a thickness of 7 kÅ to 11 kÅ and disposed over the layer of high-density plasma silicon dioxide film.

* * * * *